US011651902B2

(12) United States Patent
Jain et al.

(10) Patent No.: US 11,651,902 B2
(45) Date of Patent: May 16, 2023

(54) PATTERNING OF THIN FILM CAPACITORS IN ORGANIC SUBSTRATE PACKAGES

(71) Applicant: Intel Corporation, Santa Clara, CA (US)

(72) Inventors: Rahul Jain, Gilbert, AZ (US); Andrew J. Brown, Phoenix, AZ (US); Prithwish Chatterjee, Tempe, AZ (US); Sai Vadlamani, Chandler, AZ (US); Lauren Link, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 1114 days.

(21) Appl. No.: 16/024,715

(22) Filed: Jun. 29, 2018

(65) Prior Publication Data

US 2020/0006005 A1  Jan. 2, 2020

(51) Int. Cl.
*H01L 23/522* (2006.01)
*H01G 4/33* (2006.01)
*H01L 49/02* (2006.01)

(52) U.S. Cl.
CPC .......... *H01G 4/33* (2013.01); *H01L 23/5222* (2013.01); *H01L 28/40* (2013.01)

(58) Field of Classification Search
CPC ............... H01L 23/49822; H01L 28/00; H01L 21/4857; H01L 23/5222; H01L 28/40; H01L 28/55; H01G 4/33
USPC ........................................................ 257/532
See application file for complete search history.

(56) References Cited

U.S. PATENT DOCUMENTS

| 5,785,837 | A | * | 7/1998 | Bhattacharya | ............ | C25C 5/02 |
| | | | | | | 205/224 |
| 6,337,216 | B1 | * | 1/2002 | Koo | ................ | H01L 27/11502 |
| | | | | | | 257/E21.009 |
| 9,633,837 | B2 | * | 4/2017 | Raghunathan | ...... | H01L 21/0217 |
| 2001/0012698 | A1 | * | 8/2001 | Hayashi | ............ | H01L 21/02205 |
| | | | | | | 438/782 |
| 2004/0228172 | A1 | * | 11/2004 | Rinerson | ............ | G11C 13/0007 |
| | | | | | | 365/158 |
| 2006/0079050 | A1 | * | 4/2006 | Cahalen | ................ | H01G 4/005 |
| | | | | | | 438/250 |
| 2006/0289976 | A1 | * | 12/2006 | Min | ........................ | H01G 4/33 |
| | | | | | | 257/678 |
| 2010/0024181 | A1 | * | 2/2010 | Figueroa | .................. | H01G 4/33 |
| | | | | | | 29/25.42 |

OTHER PUBLICATIONS

MerriamWebster OnLine Dictionary Definition of Pattern. No Date.*

* cited by examiner

*Primary Examiner* — Hrayr A Sayadian
(74) *Attorney, Agent, or Firm* — Schwabe, Williamson & Wyatt P.C.

(57) ABSTRACT

Embodiments herein relate to systems, apparatuses, processing, and techniques related to patterning one or more sides of a thin film capacitor (TFC) sheet, where the TFC sheet has a first side and a second side opposite the first side. The first side and the second side of the TFC sheet are metal and are separated by a dielectric layer, and the patterned TFC sheet is to provide at least one of a capacitor or a routing feature on a first side of a substrate that has the first side and a second side opposite the first side.

17 Claims, 6 Drawing Sheets

PATTERNING OF THIN FILM CAPACITORS IN ORGANIC SUBSTRATE PACKAGES

FIELD

Embodiments of the present disclosure generally relate to the field of package assemblies, and in particular package assemblies using thin film capacitors (TFCs).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Continued reduction in end product size of mobile electronic devices such as smart phones and ultrabooks is a driving force for the development of reduced size systems in package components. Power management within these package components have included land-side capacitors (LSCs) attached to the back side of substrates of the components.

DETAILED DESCRIPTION

Embodiments of the present disclosure may generally relate to a TFC sheet with a first side and a second side opposite the first side, where the first side is to couple with a first side of a substrate. The first side of the TFC sheet and the second side of the TFC sheet may be metal layers separated by a dielectric layer and at least one of the metal layers of the TFC sheet may be patterned. Subsequently, in embodiments, holes, such as laser-drilled VIAs, may be drilled through the patterned TFC sheet, for example where the metal first side of the TFC sheet proximate to the drilled holes is removed, into the substrate exposing a metal pad in the substrate. The drilled holes may subsequently be plated with copper (Cu), and may be subsequently filled with Cu to create a capacitor. These implementations, along with implementations of other related embodiments, may facilitate power management by using patterned TFCs during package manufacture. TFC may be discreet and be available in sheets.

In legacy implementations, LSCs have been attached to the back side of a substrate. These implementations have encountered some limitations due to the available space on the back-side of the LSC, and also due to the distance between the LSC and the die attached on the front side of the substrate.

Embodiments herein may be directed to techniques and processes to pattern or to etch TFC material in order to transform TFC sheets into discrete capacitors when applied to desired substrate locations, for example in specific areas within an organic package. These techniques and processes may incorporate pre-patterned TFC sheets to implement other routing features.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the figures, and sizes, thicknesses, or dimensions may be assumed for some embodiments only where specifically indicated or discussed.

Figure 1:
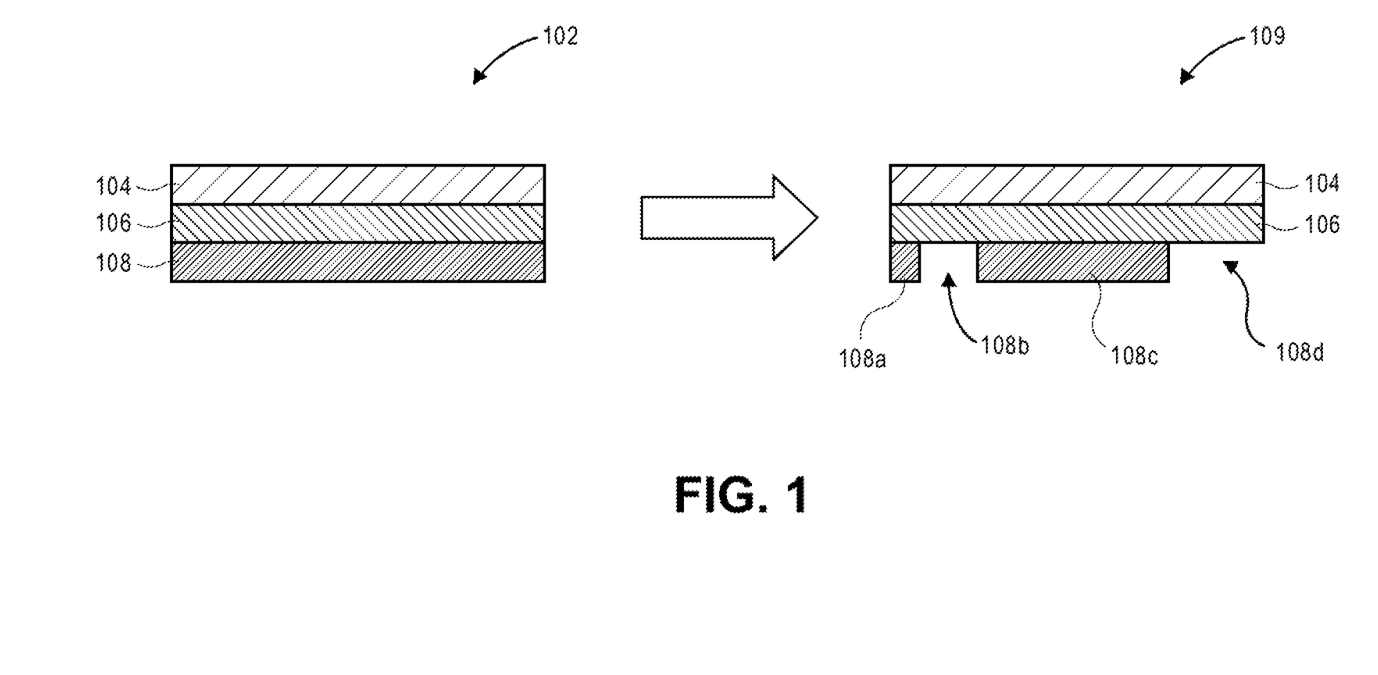
FIG. 1 illustrates an example TFC that has been patterned, in accordance with embodiments.

FIG. 1 illustrates an example TFC that has been patterned, in accordance with embodiments. A non-patterned TFC 102 is shown that contains three laminated layers. The first layer 104 and the third layer 108 are metal layers that may include copper (Cu), nickel (Ni), or some other suitable metal material. The middle layer 106 is a barrier layer that may serve as a dielectric to separate and to electrically isolate the first layer 104 from the third layer 108. The middle layer 106 may include barium titanate ($BaTiO_3$) or some other suitable dielectric material.

In embodiments, the TFC 102 may be produced in a sheet form that may cover all or part of a surface of a substrate or of a wafer. The TFC 102 may be patterned to remove portions of the first layer 104 or the third layer 108. Patterning may be accomplished by using subtractive etching through established chemistries.

A patterned TFC 109 is shown where the third layer 108 has been etched away at spaces 108b, 108d to the middle layer 106 dielectric, and leaving third layer 108a, 108c metals intact. In other embodiments, portions of one or more of the other layers 104, 106, 108 have portions etched away or otherwise removed.

The patterned TFC 109 may then be applied to a substrate as shown in FIGS. 2A-2K.

FIGS. 2A-2K illustrate an example sequence of actions using a thin film capacitor (TFC) sheet to create a capacitor structure within a package, in accordance with embodiments.

In various embodiments, not all actions may be performed and/or the actions may be performed in different sequences.

Figure 2A:
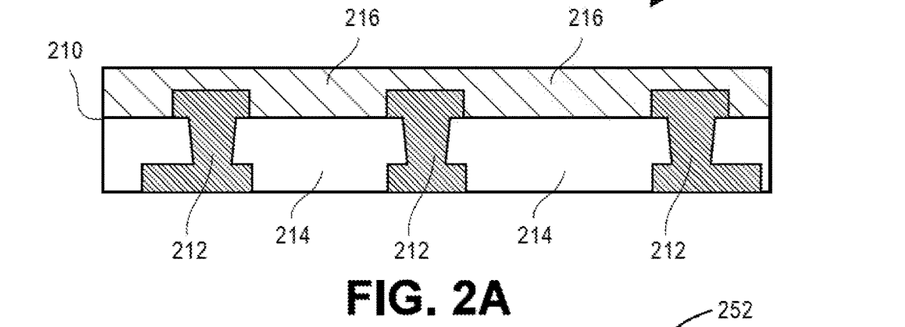
FIGS. 2A-2K illustrate an example sequence of actions using a thin film capacitor (TFC) sheet to create a capacitor structure within a package, in accordance with embodiments.

In FIG. 2A, action 250, a substrate 210 may be built up that includes one or more copper features 212 that may extend through a first substrate layer 214 and into a buildup layer 216. In other embodiments, the copper features 212 may represent any electrical features that may be included within a substrate 210. In embodiments, the first substrate layer 214 and the buildup layer 216 may be a single layer, or may be multiple layers within the substrate 210.

Figure 2B:
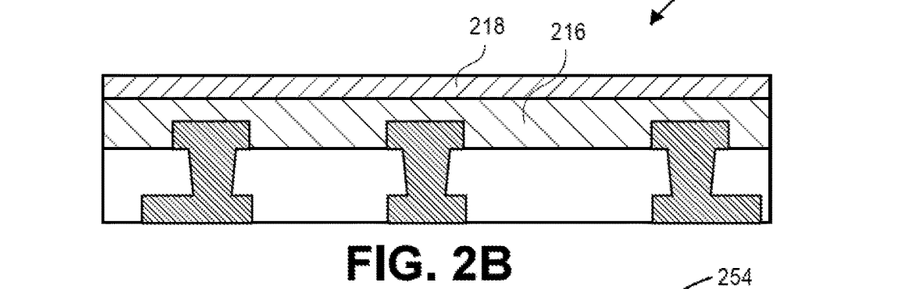

In FIG. 2B, at action 252, a laminate primer layer 218 may be applied over the buildup layer 216. The laminate primer layer 218 is to receive and to secure a patterned TFC such as patterned TFC 109 of FIG. 1. In embodiments, the laminate primer layer 218 may be uncured, and may be a buildup primer or any other suitable substance to adhere the patterned TFC.

Figure 2C:
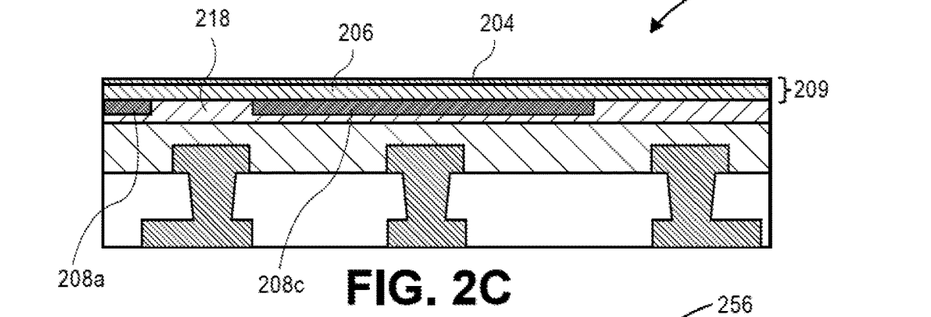

In FIG. 2C, at action 254, the patterned TFC 209, which may be similar to patterned TFC 109 of FIG. 1, is placed on the laminate primer layer 218. In embodiments, the patterned layer that includes metal sections 208a, 208c, which may be similar to metal sections 108a, 108c of FIG. 1, may be pressed into the laminate primer layer 218. As a result, the laminate primer layer 218 may fill in between the metal sections 208a, 208c. In embodiments, the metal first layer 204 of patterned TFC 209 may be a Cu layer that is thinned in preparation for patterning.

Figure 2D:
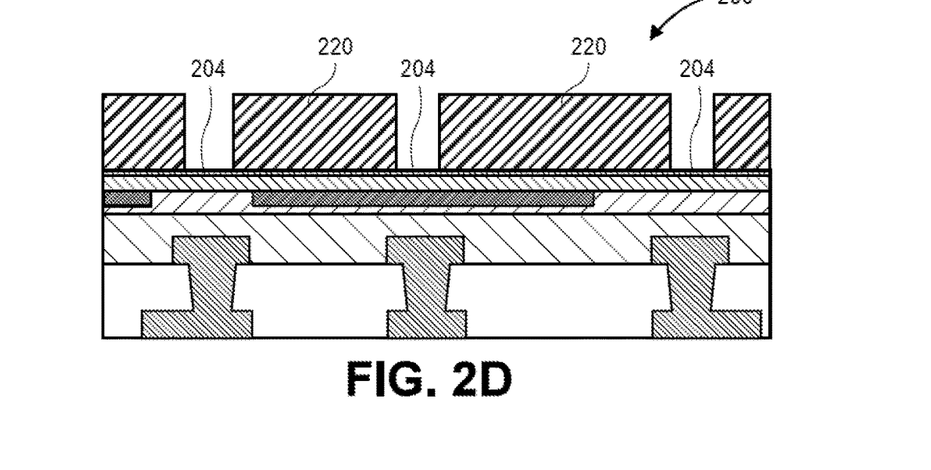

In FIG. 2D, at action 256, the metal first layer 204 is a Cu layer that may have been thin at action 254. In embodiments, dry film resist (DFR) pillars 220 may be placed upon the metal first layer 204. In embodiments, a suitable material other than DFR may be used. This may be in preparation for etching the first metal layer 204 (Cu) in between the DFR pillars 220. In embodiments, the DFR pillars 220 may be created by applying a layer of DFR (not shown) on top of the metal first layer 204, and then etching away DFR until the DFR pillars 220 remain.

Figure 2E:
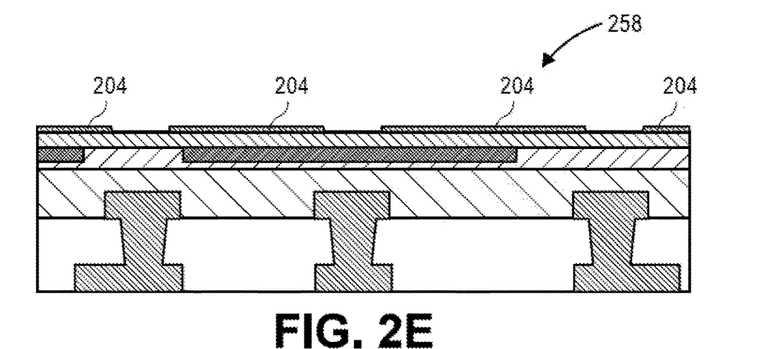

In FIG. 2E, at action 258, the metal first layer 204 from action 256 is patterned. A metal etching may be performed on the metal first layer 204 before the DFR pillars 220 are removed to selectively remove portions of the metal first layer 204. In embodiments, the etching may be done using either wet or dry etching treatments. As a result, portions of the metal first layer 204 remain. In embodiments, these portions of the metal first layer 204 may be used as a stop layer for subsequent etching as described in action 260.

Figure 2F:
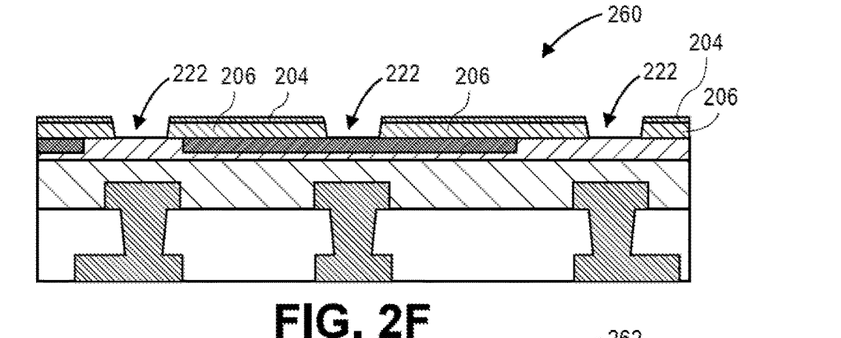

In FIG. 2F, at action 260, the metal first layer 204, which may be a Cu layer, may act as an etch stop while the middle layer 206, which may be a dielectric, may be etched away. In embodiments, portions of the middle layer 206, for example that may include $BaTiO_3$, may be etched away to leave middle layer voids 222. In embodiments the etching may be a wet etch using hydrofluoric acid, or a dry etch using fluorine plasma, to etch the middle layer 206. In embodiments, areas of the middle layer 206 that are below the metal first layer 204 may not be etched away due to the etch stop effect of the remaining first metal layer 204.

Figure 2G:
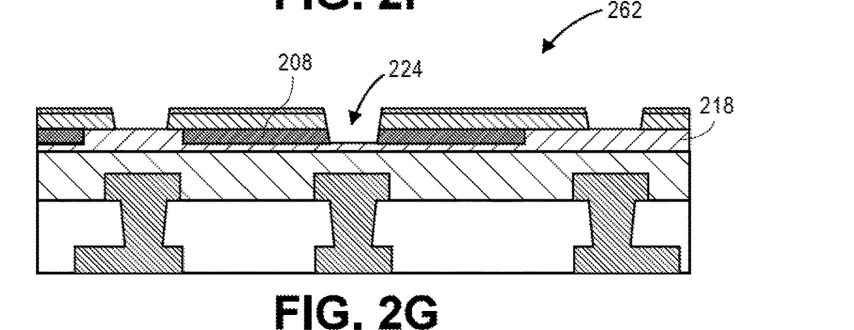
Figure 2H:
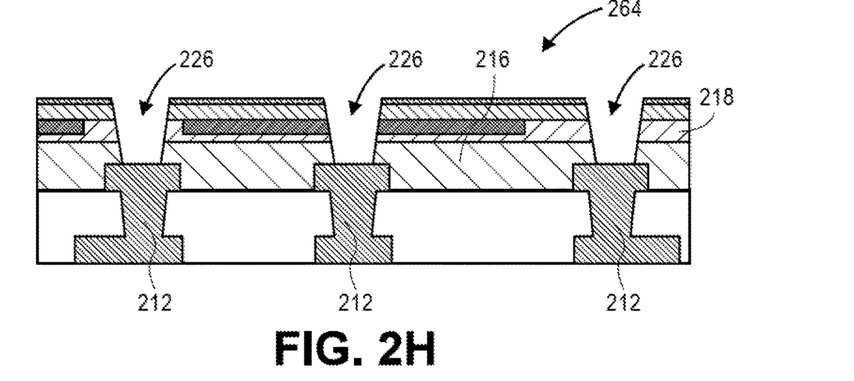

In FIG. 2G, at action 262, the metal third layer 208, which may be patterned as described in previous actions, is etched away to form partial cavities 224. In embodiments, where the metal third layer 208 is Ni, nickel-etch chemistry may be used to form partial cavities 224, that may stop at laminate primer layer 218.

Figure 2I:
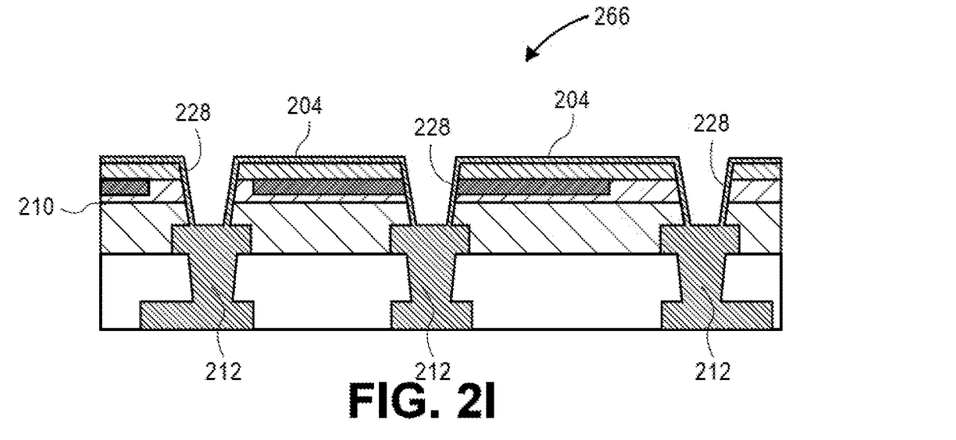

In FIG. 2I, at action 264, laser drilling, or some other drilling or etching process, may be used to complete partial vias 226 to expose the copper features 212. In embodiments, the drilling or etching process may drill through the laminate primer layer 218 and/or the buildup layer 216

In FIG. 2I, at action 266, a desmear process may be implemented and a metal plating 228 applied to a side of the package 210. In embodiments, the metal plating 228 may be a Cu plating that may be applied through an electroless plating process. In embodiments, the metal plating 228 may be applied on top of the metal first layer 204. In embodiments, this may result in an electrical coupling among the copper features 212, the metal plating 228, and the metal first layer 204.

Figure 2J:
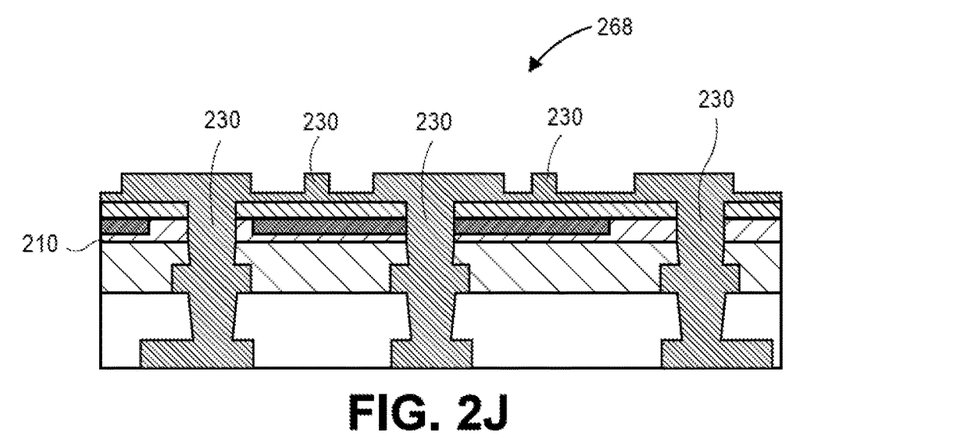

In FIG. 2J, at action 268, additional metal features 230 may be applied to a side of the substrate 210. In embodiments, the metal features 230 may fill in the openings 226 created in previous actions. In embodiments, the metal features 230 may be constructed using DFR lamination, etching, plating, for example Cu plating, and then DFR stripping (not shown).

Figure 2K:
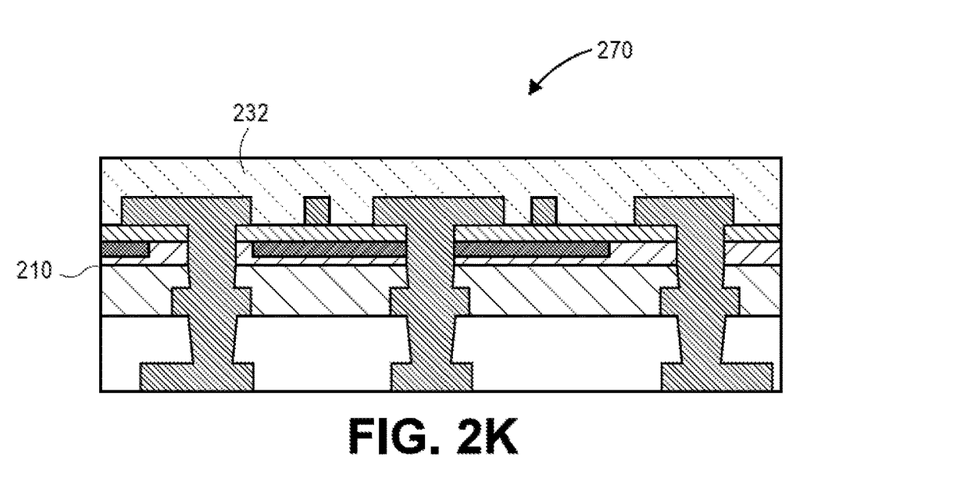

In FIG. 2K, at action 270, a second buildup layer 232 may be applied on a side of the substrate 210.

Figure 3:
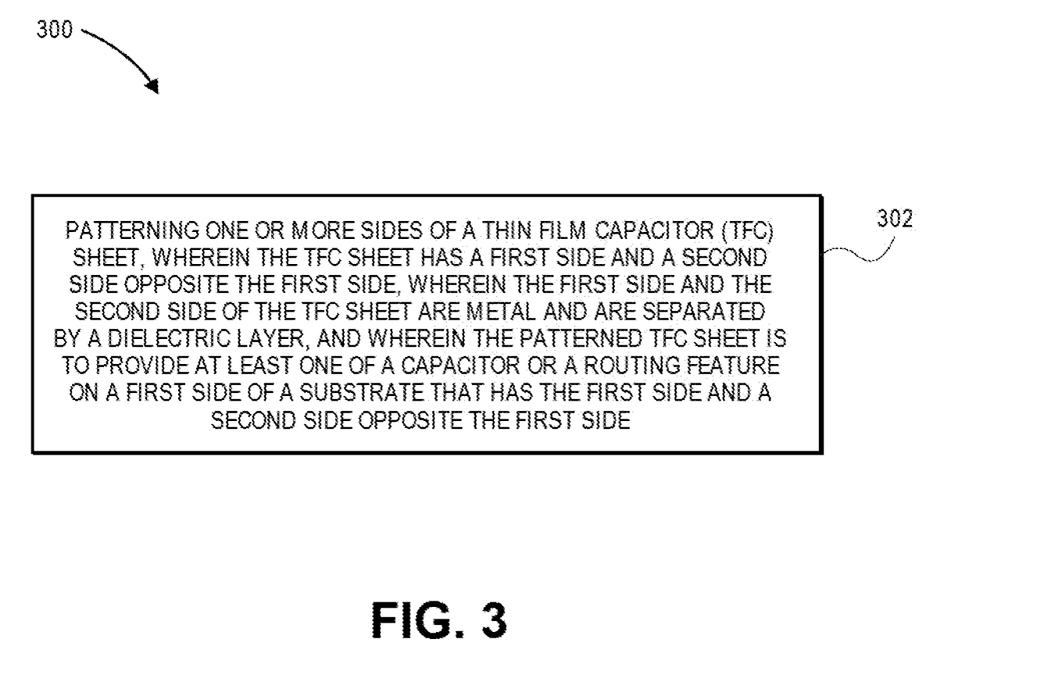
FIG. 3 illustrates an example of a process for manufacturing a package assembly, in accordance with embodiments

FIG. 3 illustrates an example of a process for manufacturing a package assembly, in accordance with embodiments. In embodiments, process 300 may be performed by one or more of the techniques, processes, or actions described with respect to FIGS. 1-2K.

At block 302, the process may include patterning one or more sides of a TFC sheet, wherein the TFC sheet has a first side and a second side opposite the first side, wherein the first side and the second side of the TFC sheet are metal and are separated by a dielectric layer, and wherein the patterned TFC sheet is to provide at least one of a capacitor or a routing feature on a first side of a substrate that has the first side and a second side opposite the first side. In embodiments, the TFC sheet may be similar to TFC sheet 102 of FIG. 1. The first side or the second side may be similar to the metal first layer 104 or the metal third layer 108 of FIG. 1. The dielectric layer may be similar to the second layer 106 of FIG. 1.

In embodiments, the patterned one or more sides of the TFC may be similar to the patterning shown for TFC 109 of FIG. 1, which includes areas of a metal third layer 108a, 108c that are separated by gaps 108b, 108d. The first side of the substrate may be similar to substrate 210 of FIG. 2. The patterned TFC sheet may be applied to the buildup layer 216 substrate 210 using a laminate primer layer 218.

Subsequent processes may include applying electrical features, plating, etching, and/or drilling to incorporate the electrical routing characteristics of the patterned TFC sheet into the electrical characteristics of the substrate 210. Embodiments of these may be shown in one or more of the actions 250, 252, 254, 256, 258, 260, 262, 264, 266, 268, and 270 of FIGS. 1-2K.

Figure 4:
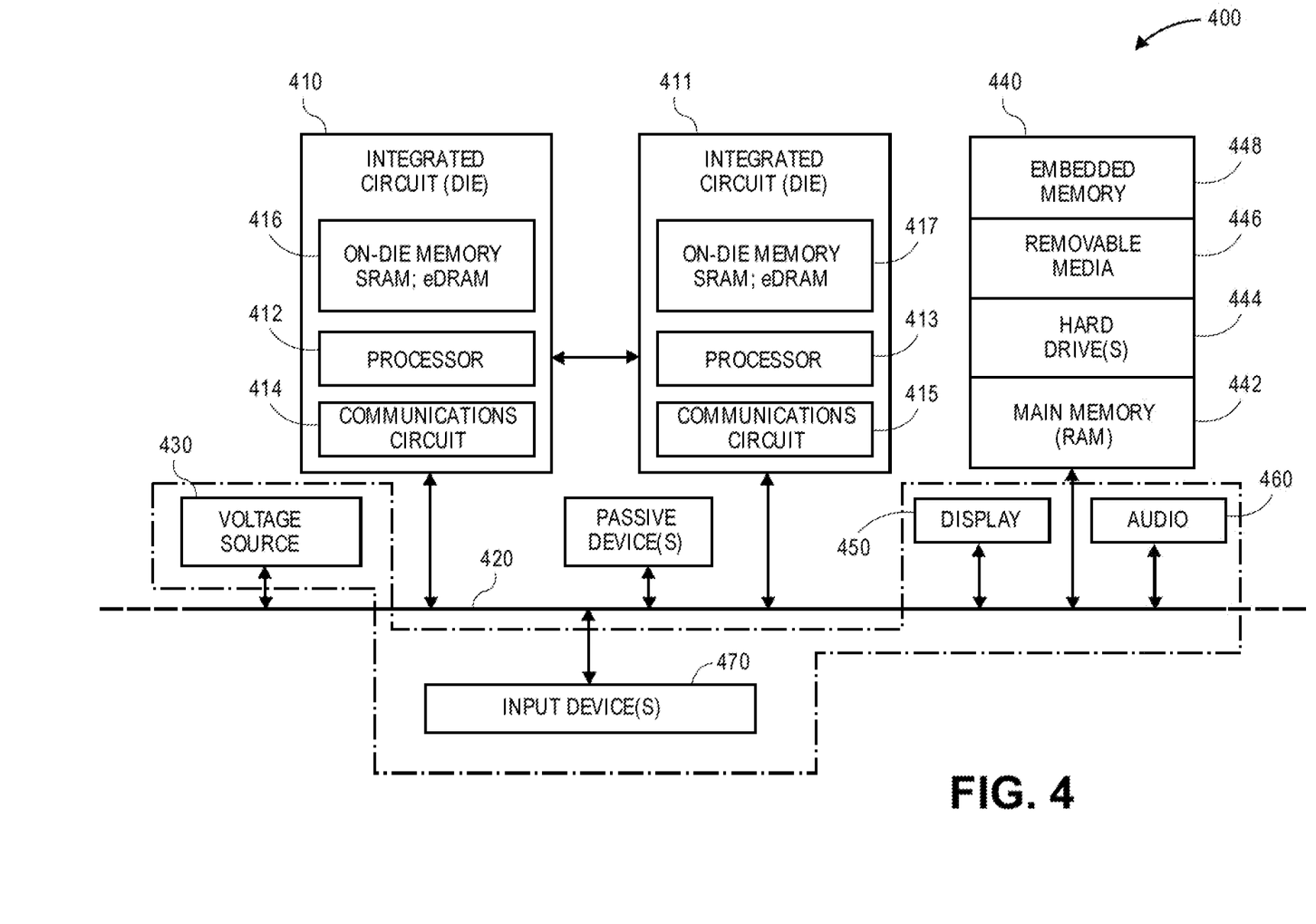
FIG. 4 is a schematic of a computer system 400, in accordance with an embodiment of the present invention.

FIG. 4 is a schematic of a computer system 400, in accordance with an embodiment of the present invention. The computer system 400 (also referred to as the electronic system 400) as depicted can embody a patterned thin film capacitor, according to any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be a server system. The computer system 400 may be a supercomputer or high-performance computing system.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. In an embodiment, the processor 412 includes, or is coupled with, a patterned thin film capacitor, as disclosed herein. In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAM).

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in a die stack, according to an embodiment.

In an embodiment, the electronic system 400 also includes a display device 450, an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

As shown herein, the integrated circuit 410 can be implemented in a number of different embodiments, including a package substrate having a patterned thin film capacitor, according to any of the several disclosed embodiments and their equivalents, an electronic system, a computer system, one or more methods of fabricating an integrated circuit, and one or more methods of fabricating an electronic assembly that includes a package substrate having a patterned thin film capacitor, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having patterned thin film capacitor embodiments and their equivalents. A foundation substrate may be included, as represented by the dashed line of FIG. 4. Passive devices may also be included, as is also depicted in FIG. 4.

The following paragraphs describe examples of various embodiments.

Example 1 may be a package comprising: a thin film capacitor (TFC) sheet with a first side and a second side opposite the first side, wherein the first side is to couple with a first side of a substrate; wherein the first side of the TFC sheet and the second side of the TFC sheet are metal layers separated by a dielectric layer; and wherein at least one of the metal layers of the TFC sheet is patterned.

Example 2 may include the package of example 1, wherein the patterned TFC sheet is to provide at least one of a capacitor or a routing feature when coupled with the first side of the substrate.

Example 3 may include the package of example 1, further comprising the substrate having a second side opposite the first side; and wherein the first side of the TFC sheet is coupled with the first side of the substrate.

Example 4 may include the package of example 3, further comprising a laminate primer layer between the first side of the TFC sheet and the first side of the substrate to adhere the first side of the TFC sheet to the first side of the substrate.

Example 5 may include the package of example 3, further comprising a copper (Cu) layer disposed on a portion of the second side of the TFC sheet.

Example 6 may include the package of example 3, further comprising a via disposed into the package through the TFC sheet and through the first side of the substrate to expose an electrical component within the substrate.

Example 7 may include the package of example 6, further comprising a conductive metal disposed on a surface of the via to coat the via and to electrically couple the electrical component in the substrate with a portion of the TFC sheet.

Example 8 may include the package of example 7, wherein the coated via is a first coated via and the electrical component in the substrate is a first electrical component; and further comprising: a second coated via electrically coupled to a second electrical component in the substrate, wherein the second coated via is electrically coupled with the portion of the TFC sheet; and wherein the portion of the TFC sheet is a capacitor powered by the first electrical component in the substrate or the second electrical component in the substrate.

Example 9 may include the package of example 1, wherein the first side of the TFC sheet is nickel (Ni) and the second side of the TFC sheet is Cu.

Example 10 may include the package of example 1, wherein the dielectric layer of the TFC sheet is a Barium Titanate (BaTiO$_3$) layer.

Example 11 may be a method comprising: patterning one or more sides of a thin film capacitor (TFC) sheet, wherein the TFC sheet has a first side and a second side opposite the first side, wherein the first side and the second side of the TFC sheet are metal and are separated by a dielectric layer, and wherein the patterned TFC sheet is to provide at least one of a capacitor or a routing feature on a first side of a substrate that has the first side and a second side opposite the first side.

Example 12 may include the method of example 11, further comprising coupling the first side of the patterned TFC sheet to the first side of the substrate.

Example 13 may include the method of example 12, wherein coupling the patterned TFC sheet onto the first side of the substrate further includes applying a laminate primer layer to the first side of the substrate to adhere the first side of the TFC sheet to the first side of the substrate.

Example 14 may include the method of example 12, further comprising applying copper (Cu) to portions of the second side of the patterned TFC sheet.

Example 15 may include the method of example 12, further comprising creating a via through the patterned TFC sheet and through the first side of the substrate to expose an electrical component disposed within the substrate.

Example 16 may include the method of example 15, further comprising applying a conductive metal coating to a surface of the via to electrically couple the electrical component disposed within the substrate and a metal layer of the TFC sheet.

Example 17 may include the method of any one of examples 11-16, wherein the first or the second side of the TFC is copper (Cu) or nickel (Ni).

Example 18 may be an apparatus comprising: means for patterning one or more sides of a thin film capacitor (TFC) sheet, wherein the TFC sheet has a first side and a second side opposite the first side, wherein the first side and the second side of the TFC sheet are metal and are separated by a dielectric layer, wherein the patterned TFC sheet is to provide at least one of a capacitor or a routing feature on a first side of a substrate that has the first side and a second side opposite the first side.

Example 19 may include the apparatus of example 18, further comprising means for coupling the first side of the patterned TFC sheet to the first side of the substrate.

Example 20 may include the apparatus of example 19, further comprising: means for creating a via through the patterned TFC sheet and through the first side of the substrate to expose an electrical component disposed in the substrate; and means for applying a conductive metal coating to the surface of the via to electrically couple the electrical component disposed within the substrate and a metal layer of the TFC sheet.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A method comprising:
providing a thin film capacitor (TFC) sheet, wherein the TFC sheet has a first side and a second side opposite the first side, wherein the first side of the TFC sheet is a first metal layer and the second side of the TFC sheet is a second metal layer and wherein the first side and the second side are separated by a dielectric layer;
removing a first portion of the first metal layer from the first side of the TFC sheet;
providing a substrate;
applying an adhesive layer on a side of the substrate;
physically coupling the first side of the TFC sheet with the side of the substrate using the adhesive layer;
removing a second portion of the second metal layer from the second side of the TFC; and
removing a third portion of the dielectric layer, the third portion of the dielectric layer between the removed second portion of the second metal layer of the second side of the TFC and the substrate.

2. The method of claim 1, further comprising applying copper (Cu) to portions of the remaining second metal layer of the second side of the TFC sheet.

3. The method of claim 2, further comprising creating a via through the TFC sheet and through the side of the substrate to expose an electrical component disposed within the substrate.

4. The method of claim 3, further comprising applying a conductive metal coating to a surface of the via to electrically couple the electrical component disposed within the substrate and a metal of the second side of the TFC sheet.

5. The method of claim 1, wherein the first metal layer of the first side of the TFC or the second metal layer of the second side of the TFC includes a selected one or more of: copper (Cu) or nickel (Ni).

6. The method of claim 1, wherein the dielectric layer includes barium, titanium, and oxygen.

7. The method of claim 1, wherein removing the third portion of the dielectric layer further includes etching the third portion of the dielectric layer.

8. The method of claim 7, wherein etching includes etching using hydrofluoric acid.

9. The method of claim 7, wherein etching includes etching using fluorine plasma.

10. A package comprising:
- a substrate;
- an adhesive layer on a side of the substrate;
- a first layer on the adhesive layer, at least a portion of the first layer including a first metal;
- a dielectric layer on the first layer;
- a second layer on the dielectric layer, at least a portion of the second layer including a second metal;
- a metal feature extending from the second metal portion of the second layer through the dielectric layer to the first metal portion of the first layer; and
- wherein a portion of the dielectric layer proximate to the metal feature includes fluorine.

11. The package of claim 10, wherein the dielectric layer includes barium, titanium, and oxygen.

12. The package of claim 10, wherein the adhesive layer is a laminate primer layer.

13. The package of claim 10, wherein the substrate includes an electrical component; and wherein the metal feature extends through the substrate to the electrical component and electrically couples with the electrical component.

14. The package of claim 10, wherein the metal feature is a first metal feature; and further comprising:
- a second metal feature extending from another second metal portion of the second layer through the dielectric layer to the substrate, wherein a portion of the dielectric layer proximate to the second metal feature includes fluorine.

15. The package of claim 14, wherein the second metal feature is electrically isolated from the first metal portion of the first layer.

16. The package of claim 15, wherein the other second metal portion of the second layer overlaps the first metal portion of the first layer.

17. The package of claim 10, wherein the first metal of the first layer or the second metal of the second layer includes a selected one or more of: nickel or copper.

* * * * *